(12) United States Patent
Hu et al.

(10) Patent No.: US 7,893,464 B2
(45) Date of Patent: Feb. 22, 2011

(54) SEMICONDUCTOR PHOTODIODE AND METHOD OF MANUFACTURE THEREOF

(75) Inventors: Syn-Yem Hu, San Jose, CA (US); Zhong Pan, San Jose, CA (US)

(73) Assignee: JDS Uniphase Corporation, Milpitas, CA (US)

( * ) Notice: Subject to any disclaimer, the term of this patent is extended or adjusted under 35 U.S.C. 154(b) by 313 days.

(21) Appl. No.: 12/057,937

(22) Filed: Mar. 28, 2008

(65) Prior Publication Data
US 2009/0242933 A1    Oct. 1, 2009

(51) Int. Cl.
*H01L 29/73* (2006.01)
(52) U.S. Cl. .................. 257/199; 257/186; 257/481
(58) Field of Classification Search .......... 257/186, 257/199, 481
See application file for complete search history.

(56) References Cited

U.S. PATENT DOCUMENTS

| | | | |
|---|---|---|---|
| 5,144,381 A | 9/1992 | Furuyama et al. | 357/30 |
| 5,543,629 A | 8/1996 | Nakamura et al. | 257/21 |
| 5,610,416 A | 3/1997 | Su et al. | 257/186 |
| 5,712,504 A | 1/1998 | Yano et al. | 257/452 |
| 5,843,804 A | 12/1998 | Su et al. | 438/91 |
| 5,866,936 A | 2/1999 | Hasnain et al. | 257/452 |
| 5,910,014 A | 6/1999 | Iwasaki et al. | 438/91 |
| 6,015,721 A | 1/2000 | Kim | 438/91 |
| 6,229,162 B1 | 5/2001 | Watanabe | 257/184 |
| 6,515,315 B1 | 2/2003 | Itzler et al. | 257/186 |
| 6,706,542 B1 | 3/2004 | Geva et al. | 438/7 |
| 6,730,979 B2 | 5/2004 | Boisvert | 257/438 |
| 6,753,214 B1 | 6/2004 | Brinkmann et al. | 438/184 |
| 6,756,613 B2 | 6/2004 | Yuan | 257/186 |
| 6,800,914 B2 | 10/2004 | Ito et al. | 257/438 |
| 7,038,251 B2 | 5/2006 | Ishimura et al. | 257/186 |
| 7,105,369 B2 | 9/2006 | Yuan | 438/39 |

(Continued)

FOREIGN PATENT DOCUMENTS

JP          57147286 A2       9/1982

(Continued)

OTHER PUBLICATIONS

Kito et al., "High-Speed Flip-Chip InP/InGaAs Avalanche Photodiodes with Ultralow Capacitance and Large Gain-Bandwidth Products", IEEE Transactions Photonics Technology Letters, vol. 3, No. 12, pp. 1115-1116, Dec. 1991.

(Continued)

*Primary Examiner*—Fernando L Toledo
(74) *Attorney, Agent, or Firm*—Matthew A. Pequignot; Pequignot + Myers LLC (57) ABSTRACT

A method of manufacture of an avalanche photodiode involving a step of making a recess in a top window layer of an avalanche photodiode layer stack, such that a wall surrounding the recess runs smoothly and gradually from the level of the recess to the level of the window layer. Further, diffusing a dopant over the entire window layer area so as to form a p-n junction at the bottom of the recess, and providing a first electrical isolation region around the recess by buried ion implantation or wet oxidation in order to limit the flow of electrical current to the p-n junction. Forming an isolation trench around the photodiode and a second electrical isolation region by ion implantation into the trench such that the second electrical isolation region runs through the absorption layer of the photodiode.

15 Claims, 9 Drawing Sheets

U.S. PATENT DOCUMENTS

| | | | |
|---|---|---|---|
| 7,187,013 B2 | 3/2007 | Nakaji et al. | 257/186 |
| 2004/0251483 A1 | 12/2004 | Ko et al. | 257/292 |
| 2005/0025443 A1 | 2/2005 | Nakaji et al. | 385/131 |
| 2005/0047743 A1 | 3/2005 | Nakaji et al. | 385/131 |
| 2005/0156192 A1 | 7/2005 | Ko et al. | 257/186 |
| 2005/0224839 A1 | 10/2005 | Yagyu et al. | 257/199 |
| 2005/0230706 A1 | 10/2005 | Yagyu et al. | 257/186 |

OTHER PUBLICATIONS

Watanabe et al., "Reliability of Mesa-Structure InAlGaAs-InAlAs Superlattice Avalanche Photodiodes", IEEE Photonics Technology Letters, vol. 8, No. 6, pp. 824-826, Jun. 1996.

Watanabe et al., "A New Planar-Structure InAlGaAs-InAlAs Superlattice Avalanche Photodiode with a Ti-Implanted Guard-Ring", IEEE Photonics Technology Letters, vol. 8, No. 6, pp. 827-829, Jun. 1996.

Watanabe et al., "High-Reliability and Low-Dark-Current 10-Gb/s Planar Superlattice Avalanche Photodiodes", IEEE Photonics Technology Letters, vol. 9, No. 12, pp. 1619-1621, Dec. 1997.

Hayashi et al., "Microlens-Integrated Large-Area InAlGaAs-inAlAs Superlattice APD's for Eye Safety 1.5-µm Wavelength Optical Measurement Use", IEEE Photonics Technolgy Letters vol. 10, No. 4, pp. 576-578, Apr. 1998.

Hasnain et al., "Buried-Mesa Avalanche Photodiodes", IEEE Journal of Quantum Electronics, vol. 34, No. 12, pp. 2321-2326, Dec. 1998.

Watanabe et al., "High-Speed, High-Reliability Planar-Structure Superlattice Avalanche Photodiodes for 10-Gb/s Optical Receivers", IEEE Journal of Lightwave Technology, vol. 18, No. 12, pp. 2200-2207, Dec. 2000.

Yagyu et al., "Simple Planar Structure for High-Performance AlInAs Avalanche Photodiodes", IEEE Photonics Technology Letters, vol. 18, No. 1, pp. 76-78, Jan. 2006.

Yagyu et al., "Investigation of Guardring-Free Planar AlInAs Avalanche Photodiodes", IEEE Photonics Technology Letters, vol. 18, No. 11, pp. 1264-1266, Jun. 2006.

Levine et al., "A New Planar InGaAs-InAlAs Avalanche Photodiode", IEEE Photonics Technology Letters, vol. 18, No. 18, pp. 1898-1900, Sep. 2006.

SEMICONDUCTOR PHOTODIODE AND METHOD OF MANUFACTURE THEREOF

TECHNICAL FIELD

The present invention is related to semiconductor photodiodes such as positive-intrinsic-negative (p-i-n) or avalanche photodiodes, and in particular, to InAlAs/InGaAs avalanche photodiodes.

BACKGROUND OF THE INVENTION

In optical communication systems, photodetectors are used to convert optical signals into electrical signals. The most commonly used photodetectors are positive-intrinsic-negative (p-i-n) photodiodes and avalanche photodiodes.

A typical p-i-n photodiode includes an absorption layer of intrinsic, i.e. not intentionally doped, semiconductor material between a region of extrinsic, i.e. doped, semiconductor material of a first conductivity type, i.e. n-type or p-type, and a region of extrinsic semiconductor material of a second conductivity type, i.e. p-type or n-type, an arrangement that produces an electric field in the absorption layer. In operation in photoconductive mode, a reverse voltage is applied to the p-i-n photodiode to enhance the electric field in the absorption layer. Light incident on the p-i-n photodiode is absorbed by the absorption layer to generate current carriers, i.e. electrons and holes, in an absorption process. The generated current carriers are separated by the electric field in the absorption layer and drift toward the regions of extrinsic semiconductor material: holes drift toward the region of p-type semiconductor material, and electrons drift toward the region of n-type semiconductor material. The resulting photocurrent is proportional to the optical power of the incident light.

A typical avalanche photodiode includes a multiplication layer of intrinsic or lightly doped extrinsic semiconductor material, in addition to an absorption layer of intrinsic semiconductor material, between a region of extrinsic semiconductor material of the first conductivity type and a region of extrinsic semiconductor material of the second conductivity type, an arrangement that produces electric fields in the multiplication layer and the absorption layer. In operation, a large reverse voltage is applied to the avalanche photodiode to enhance the electric fields in the absorption layer and the multiplication layer. As in the p-i-n photodiode, light incident on the avalanche photodiode is absorbed by the absorption layer to generate current carriers, in an absorption process. The generated current carriers are separated by the electric field in the absorption layer, such that either holes or electrons drift toward the multiplication layer. The electric field in the multiplication layer is large enough that the holes or electrons acquire sufficient kinetic energy to generate additional current carriers through impact ionization. The generated current carriers, in turn, generate additional current carriers through impact ionization. Thus, current carriers are multiplied in an avalanche multiplication process in the multiplication layer, leading to a multiplied photocurrent.

One general concern particularly in long-haul receiver applications is the problem of reliability of photodiodes working at optical telecommunications wavelengths of about 1.3 and 1.5 microns. In order to detect light at these wavelengths, a narrow-bandgap absorption layer material, such as InGaAs, is used. It is very important not to expose a narrow-bandgap material to an external environment, especially in photodetectors used in long haul, high data rate applications. Even though effort has been invested in the development of surface-passivation techniques intended to reduce the surface defects and traps, nonetheless, many photodetector types, mesa-based photodetectors in particular, have not yet been able to deliver satisfactory performance to pass stringent Telcordia aging tests. Therefore, it is an object of the present invention to be able to manufacture photodiodes without exposing the narrow-bandgap photon absorption layer, or, preferably, InGaAs layer.

Another concern, which is related to both reliability and overall performance of avalanche photodiodes, is that of containing high electric fields within the field-charge and impact multiplication layers. Device modeling shows the electric field within these layers remains at a very high value and extends further away from the photon detection area, which can cause photodiode characteristics to drift with time.

The traditional methods of terminating the narrow-bandgap photon absorption layer(s) and/or the electric field within the field-charge layer and impact multiplication layer for p-i-n photodetectors and avalanche photodetectors fall into one of three categories:

1) Only exposing sensitive layers to air upon wafer sawing or cleaving into chips. The majority of the one-top-contact diffusion p-i-n photodiodes are fabricated this way worldwide. The narrow-bandgap photon absorption layer retains its integrity throughout the whole device area. The majority of one-top-contact (no n-well) InP/InGaAs and InAlAs/InGaAs avalanche photodiodes are also fabricated this way.

2) Only exposing sensitive layers during trench or mesa etch, with subsequent passivation of the exposed areas by one of the following: a) epitaxial regrowth and b) plasma-enhanced chemical vapor deposition (PECVD) or sputtering dielectric film(s) such as $SiN_x$ or $SiO_2$, or c) spin-coating polyimide or a BCB film.

3) Passivating sensitive areas by ion implantation within the mesa surface or within the etched trenches.

Among all these practices in the prior art, only diffusion-created field termination and surface passivation can deliver satisfactory reliability performance to meet stringent data communications and telecommunications requirements. In the present invention, the electric field within the field-charge and impact multiplication layers can be terminated at a predetermined distance away from the recess window by using a method which is most closely related to the $3^{rd}$ method above. Moreover, an additional electrical capacity reduction can be obtained by using the method of present invention.

One accepted measure of performance of a photodetector is a gain-bandwidth product. This is usually expressed as gain figure in dB multiplied by the detector bandwidth in GHz. In order to make a high-performance avalanche photodiode, one has to maximize the photocurrent multiplication while minimizing the overall device capacitance.

In order to maximize the photocurrent multiplication, one can increase the electric field across the multiplication layer. Unfortunately, increasing electric field can cause another problem to occur. Unwanted fringe electric fields often appear at the edges of electrode(s) of the photodiode, which may lead to an uncontrollable, ongoing avalanche process. In order to reduce the fringe fields, the upper electrode, i.e. the electrode facing incoming light, is often made in a form of a ring on top of the photosensitive area of the photodiode, and additional field-control ring structures are sometimes implemented. These additional field-control ring structures can increase capacitance of the avalanche photodiode.

In operation, the ring structure of the upper electrode blocks some of the photosensitive area and thereby increases requirements on optical alignment of the elements intended to deliver the light to the photodiode. Of course the ring can be made larger; but this leads to increased capacitance which further reduces the gain-bandwidth product and, therefore, reduces the benefit of having a higher photocurrent multiplication coefficient in the first place. Thus, a higher gain of an avalanche photodiode is offset by increased capacitance and reduced bandwidth due to larger electrode structure.

A number of methods have been suggested in prior art which are aimed at reduction of the photodiode capacitance and control of the fringe fields. In one method, a mesa is etched and passivated on the side of the semiconductor stack which is opposite to the ring electrode side, such that the electric field is confined to the un-etched area of the semiconductor stack. Other methods and respective devices rely on etching a concave portion in the multiplication layer of semiconductor stack, with a dopant diffusion being limited to the concave portion using photolithographically produced masks.

While to some extent being capable of limiting fringe electric fields, the methods of prior art are complex and expensive due to the increased number of diffusion steps required and also photolithographic steps required to limit dopant diffusion to the concave area only. Furthermore, the prior art methods expose the sensitive layers to environment at some point in the manufacturing process, which is detrimental to overall device reliability as has been described above. Finally, in some prior art devices, the ohmic ring contact blocks some light which otherwise could be utilized to produce photocarriers.

The present invention can be used to effectively control the fringe fields in an avalanche photodiode without compromising the gain-bandwidth product or the size of the photosensitive area of the photodiode. In addition, in the method of present invention, the sensitive layers of the semiconductor stack are not exposed to environment after initial deposition of these layers has been completed.

OBJECT OF THE INVENTION

It is an object of the present invention to provide a semiconductor photodiode which has a high gain-bandwidth product parameter and which meets high reliability standards of optical communications systems. It is also an object of present invention to provide a method of manufacture of such a photodiode which lessens the number of manufacturing steps required.

SUMMARY OF THE INVENTION

In accordance with the invention there is provided a method of manufacture of a semiconductor photodiode, comprising:

providing a semiconductor substrate;

forming a stack of layers on said substrate, including an absorption layer and a window layer on the top of the stack;

forming a recess in the window layer to a predetermined depth and lateral extent, wherein the recess has a lateral periphery;

doping the window layer with a dopant, so as to form a doped sub-layer in the window layer, wherein the doped sub-layer forms, in the recess of the window layer, a p-n junction at a boundary with a next layer in the stack, wherein said p-n junction defines a photosensitive area of the photodiode;

forming, by ion implantation or wet oxidation, an electrical isolation region surrounding the periphery of the recess, wherein said first electrical isolation region is buried underneath the doped sub-layer, so as to confine a flow of electric current to the p-n junction.

In accordance with another aspect of the invention there is further provided a semiconductor photodiode, comprising:

a semiconductor substrate;

a stack of layers on said substrate, including an absorption layer, and a window layer on the top of the stack;

wherein the window layer has a recess to a predetermined depth and lateral extent, and the recess has a lateral periphery;

wherein the recess has a substantially flat portion, and a wall surrounding the recess runs smoothly and gradually from a level of the recess to a level of a surface of the window layer, so that the strength of an electric field adjacent to the wall is less than 200% of the strength of an electric field near and under the substantially flat portion of the recess;

wherein the window layer is doped so as to form a doped sub-layer therein, and the doped sub-layer forms, in the recess of the window layer, a p-n junction at a boundary with a next layer in the stack, and wherein said p-n junction defines a photosensitive area of the photodiode; and an electrical isolation region surrounding the periphery of the recess, wherein said first electrical isolation region is formed by ion implantation or wet oxidation and is buried underneath the doped sub-layer, so as to confine a flow of electric current to the p-n junction.

BRIEF DESCRIPTION OF THE DRAWINGS

Exemplary embodiments will now be described in conjunction with the drawings in which.

DETAILED DESCRIPTION OF THE INVENTION

While the present teachings are described in conjunction with various embodiments and examples, it is not intended that the present teachings be limited to such embodiments. On the contrary, the present teachings encompass various alternatives, modifications and equivalents, as will be appreciated by those of skill in the art. Also, it should be understood that the individual steps of the methods of the present invention can be performed in any order and/or simultaneously, for as long as the invention remains operable.

Figure 1:
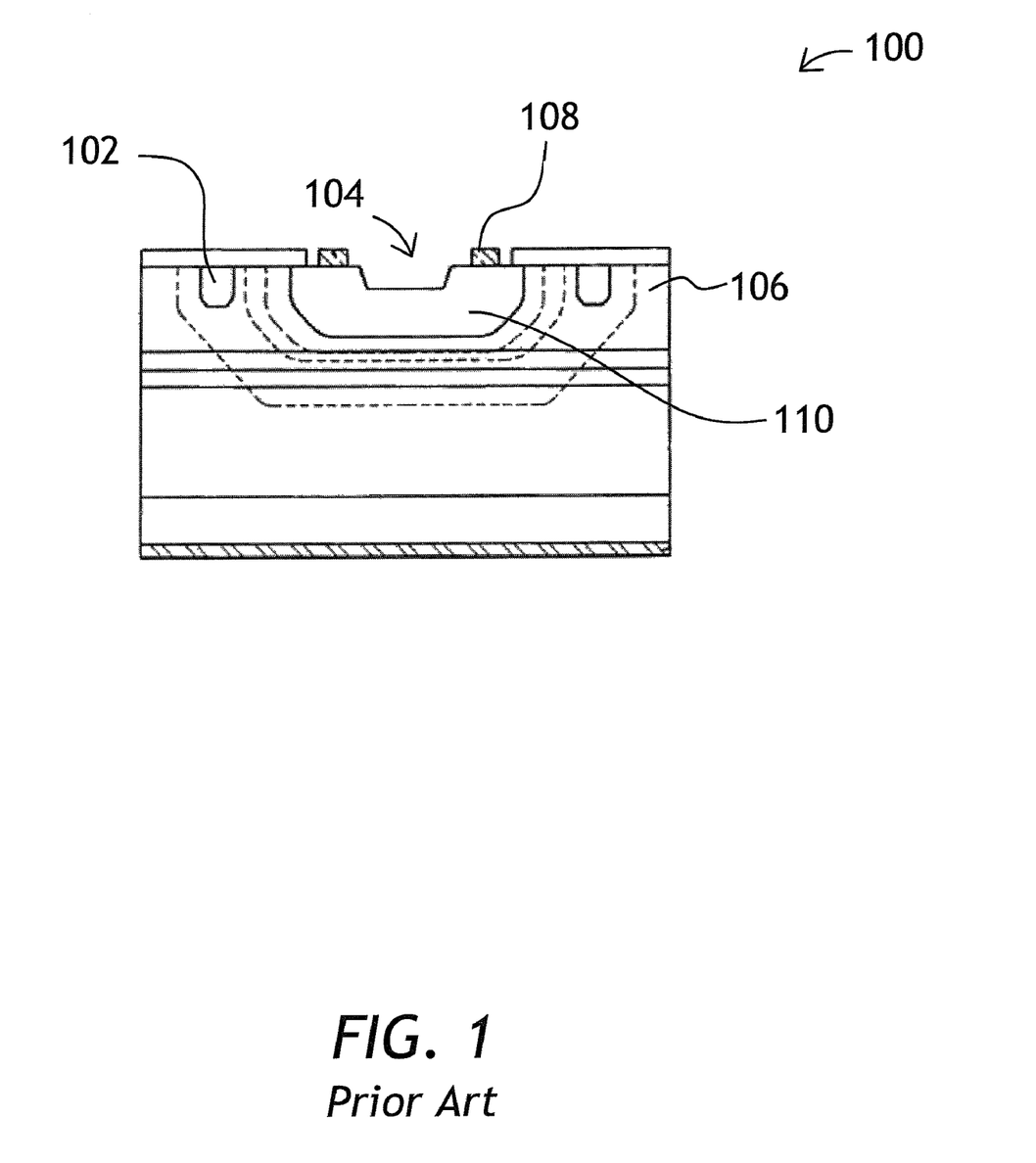
FIG. 1 is a schematic view illustrating an avalanche photodiode of prior art.

Referring now to FIG. 1, a prior art avalanche photodiode 100 having a floating protection ring 102 and a concave portion 104 in the multiplying layer 106, is shown. Double-step dopant diffusion with two intermediate photolithographic mask formation steps is necessary to create the dopant pattern including central area 110 and the protection ring 102. The p-type ohmic metal layer 108 is located in a photosensitive area of the avalanche photodiode 100 limiting useful area of the photodiode.

Figure 2:
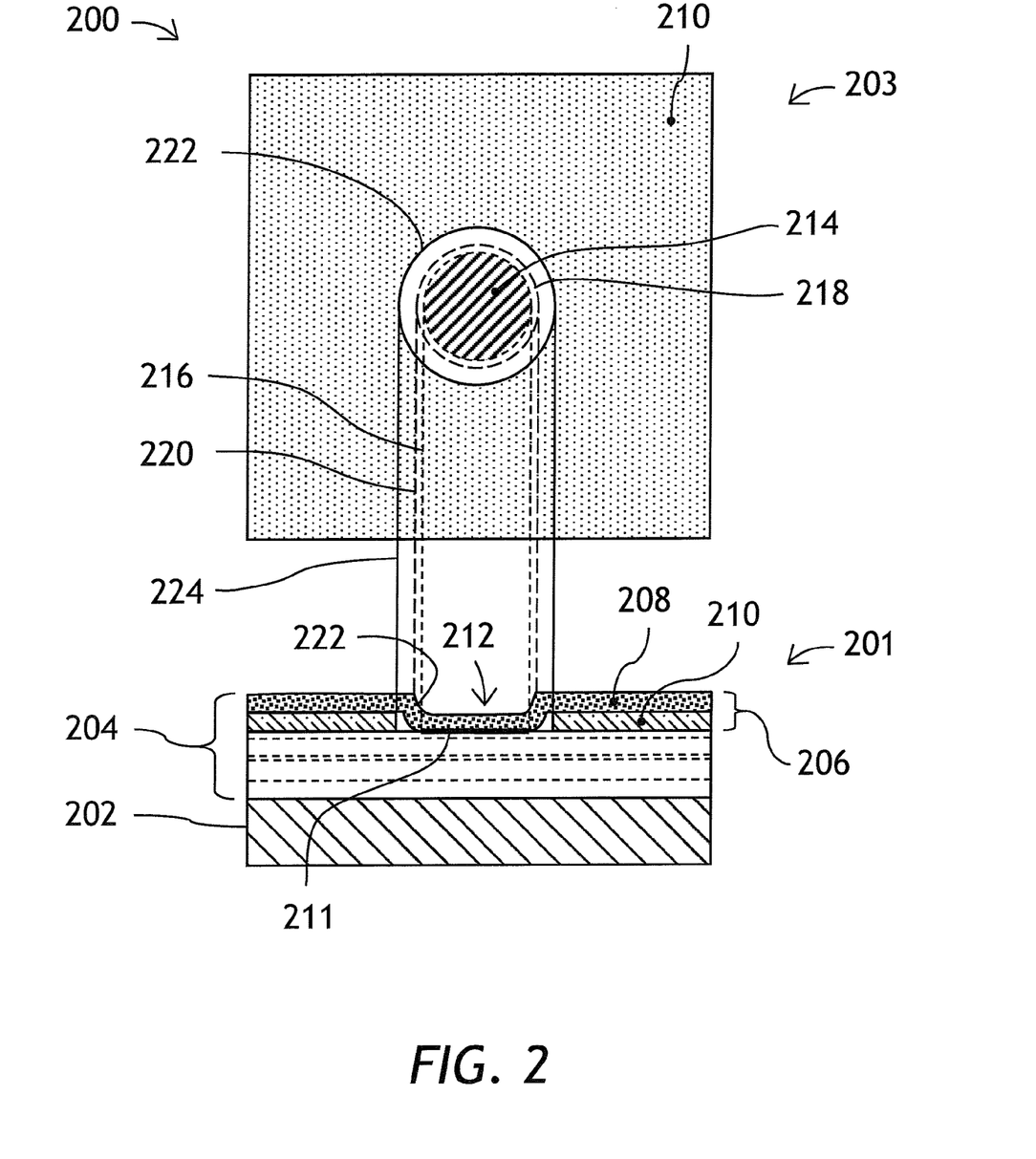
FIG. 2 combines cross-sectional and plan views depicting the basic structure of a semiconductor photodiode of present invention.

FIG. 2 depicts the basic semiconductor photodiode structure illustrating a preferred embodiment of present invention. The semiconductor photodiode 200, shown in a cross-sectional view 201 and a plan view 203, consists of a substrate 202 and semiconductor layer stack 204. The layer stack 204 contains a window layer 206 consisting of a doped sub-layer 208 and a buried ion implantation region 210. A recess 212 is implemented in window layer 206. The doped sub-layer 208 contacts a next layer in the stack which can be a narrow-bandgap absorption layer or a grading layer at an interface 211, thereby forming a photosensitive area 214 of the photodiode 200. The area 214 is a top view of the interface 211, or, in other words, is a projection of the area of interface 211 onto the plane of the substrate 202.

The relationship between the interface 211 and the photosensitive area 214 is shown schematically with projection lines 216. Similarly, the periphery of the recess 212 is represented with circle 218 surrounding the photosensitive area 214, the lines 220 symbolizing a projection of the recess 212 onto the plane of the substrate 202. The buried ion implantation region 210, in the top-view projection 203, surrounds the periphery 218 of the recess 212.

Recess 212 serves a dual function: first, it is used to define the photosensitive area 214 of the photodiode 200 and second, it serves to reduce fringe electric fields. In the method of manufacture of the photodiode 200, which will be described in detail below, the recess 212 in the window layer 206 is formed first, and doping is subsequently performed across entire window layer 206, so that in the area of recess 212 the doped sub-layer 208 touches a next layer in the stack 204 thereby forming the photosensitive area 214. The reduction of fringe electric fields is achieved by controlling the sidewall slope of the recess 212 by ensuring that a wall 222 surrounding the recess 212 runs smoothly and gradually from a level of the recess 212 to a level of a surface of the window layer 206, so that the strength of an electric field anywhere near the wall 222 is less than, for example, 200% of the strength of an electric field near and under the substantially flat portion of the recess 212.

The function of the buried ion implantation region 210 is to limit the flow of electrical current to the photosensitive area 214 and thereby reduce the capacitance and increase the gain-bandwidth product of photodiode 200. The effect of increasing the gain-bandwidth product will be explained in mode detail below.

Figure 3:
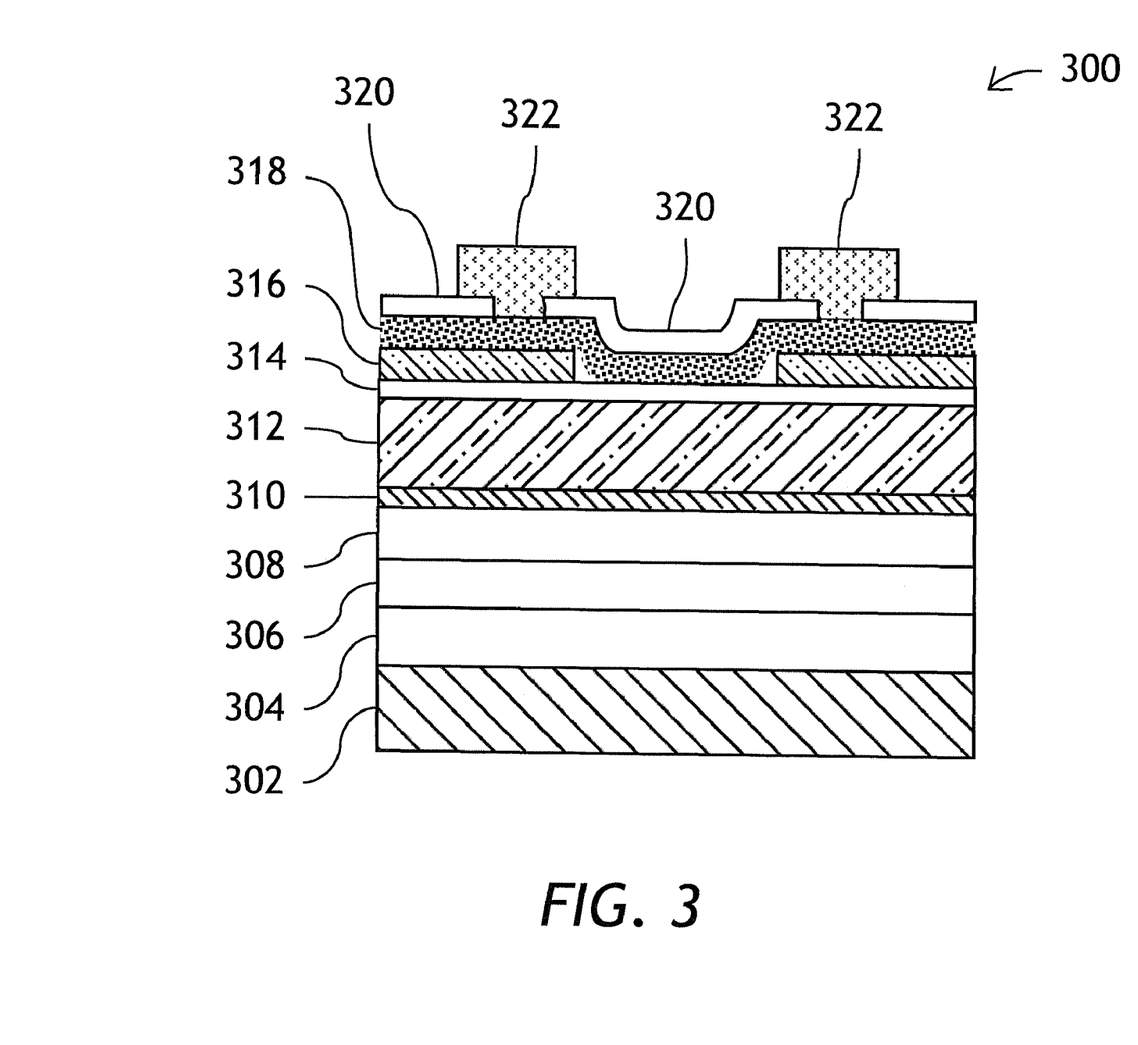
FIG. 3 shows a cross-sectional view of the avalanche photodiode of present invention.

In FIG. 3, a structure of an avalanche photodiode 300 of present invention is illustrated in more detail. The photodiode 300 is formed on a n$^+$-InP substrate 302 and contains, in a bottom-to-top succession, a n$^+$-InP buffer layer 304, a n$^+$-InAlAs buffer layer 306 for accommodating lattice mismatch, an i-InAlAs multiplication layer 308 for multiplying current carriers through an avalanche multiplication process, a n$^+$-InP or InAlAs field control charge layer 310 for controlling an electric field in the multiplication layer 308, an i-InGaAs absorption layer 312 for absorbing light to generate current carriers, an i-InGaAsP or InAlGaAs grading layer 314 for facilitating current flow, a buried ion implantation region 316 for reducing capacitance of the photodiode and directing flow of the current, a p$^+$-doped sub-layer 318, a passivation layer 320 for passivating the upper surface of the photodiode 300, and a p-metal ring layer 322 for providing an electrical contact with the doped sub-layer 318 of the photodiode 300. The layers 304-314 are formed using suitable methods established in the art, for example, using metal-organic chemical vapor deposition (MOCVD) epitaxial growth. The doped sub-layer 318 is formed, for example, by using Zn diffusion at a concentration of approximately $10^{18}$ cm$^{-3}$. The following layer description can be used as a typical example to manufacture the avalanche photodiode of present invention:

n$^+$-InP buffer layer 304: 0.5 micron;
   n$^+$-InAlAs buffer layer 306: 0.5 micron;
   i-InAlAs multiplication layer 308: 0.2 micron;
   n$^+$-InP or InAlAs field control charge layer 310: 0.1 micron;
   i-InGaAs absorption layer 312: 0.9 micron;
   i-InGaAsP or InAlGaAs grading layer 314: 0.1 micron;
   n-InP or InAlAs/InP window layer consisting of a buried ion implantation region 316 and a p$^+$-doped sub-layer 318: 1 micron.

The function of the buried ion implantation region 316 of FIG. 3 is similar to the function of buried ion implantation region 210 of FIG. 2; that is, to limit the flow of electrical current to a region under the recess 320 and thereby reduce the capacitance and increase gain-bandwidth product of photodiode 300 without sacrificing its photosensitive area. The capacitance is reduced because the buried ion implantation region 316 spreads under the contact metal ring layer 322 and screens it from the rest of the stack effectively reducing a fraction of overall capacitance associated with a capacitor formed by the ring layer 322 and the substrate 302.

Figure 4:
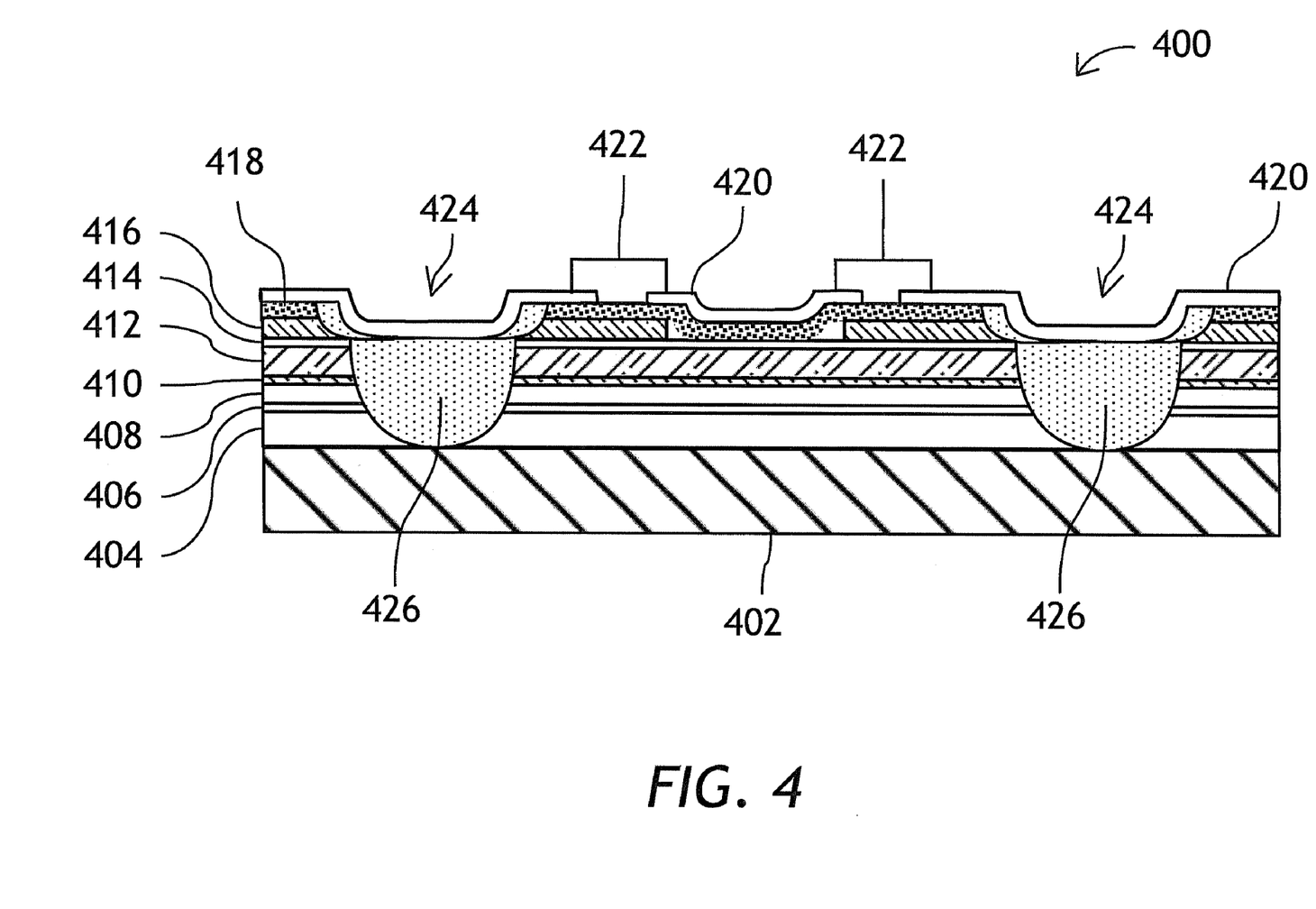
FIG. 4 depicts a cross-sectional view of an avalanche photodiode with ion implantation in isolation trench.

FIG. 4 depicts an avalanche photodiode structure 400 featuring, analogously to the structure of FIG. 3, a substrate 402, buffer layers 404 and 406, a multiplication layer 408, a field control charge layer 410, an absorption layer 412, a grading layer 414, a buried ion implantation region 416, a p+-doped sub-layer 418, a passivation layer 420, and a p-metal ring layer 422. In order to protect sensitive layers during chip dicing, an isolation trench 424 is provided surrounding the periphery of the ring 422. A buried ion implantation region 426 under the isolation trench 424 surrounds sensitive layers 404-418, effectively protecting photosensitive low bandgap energy layer 412 during dicing and packaging of the device. Thus, not only does the avalanche photodiode 400 inherit the increased gain-bandwidth product of the photodiode 300 of FIG. 3, but in addition, the reliability of the avalanche photodiode 400 of FIG. 4 is increased, since the sensitive layers, such as, for example, narrow bandgap layer 412, are never exposed to the environment.

Figure 5A:
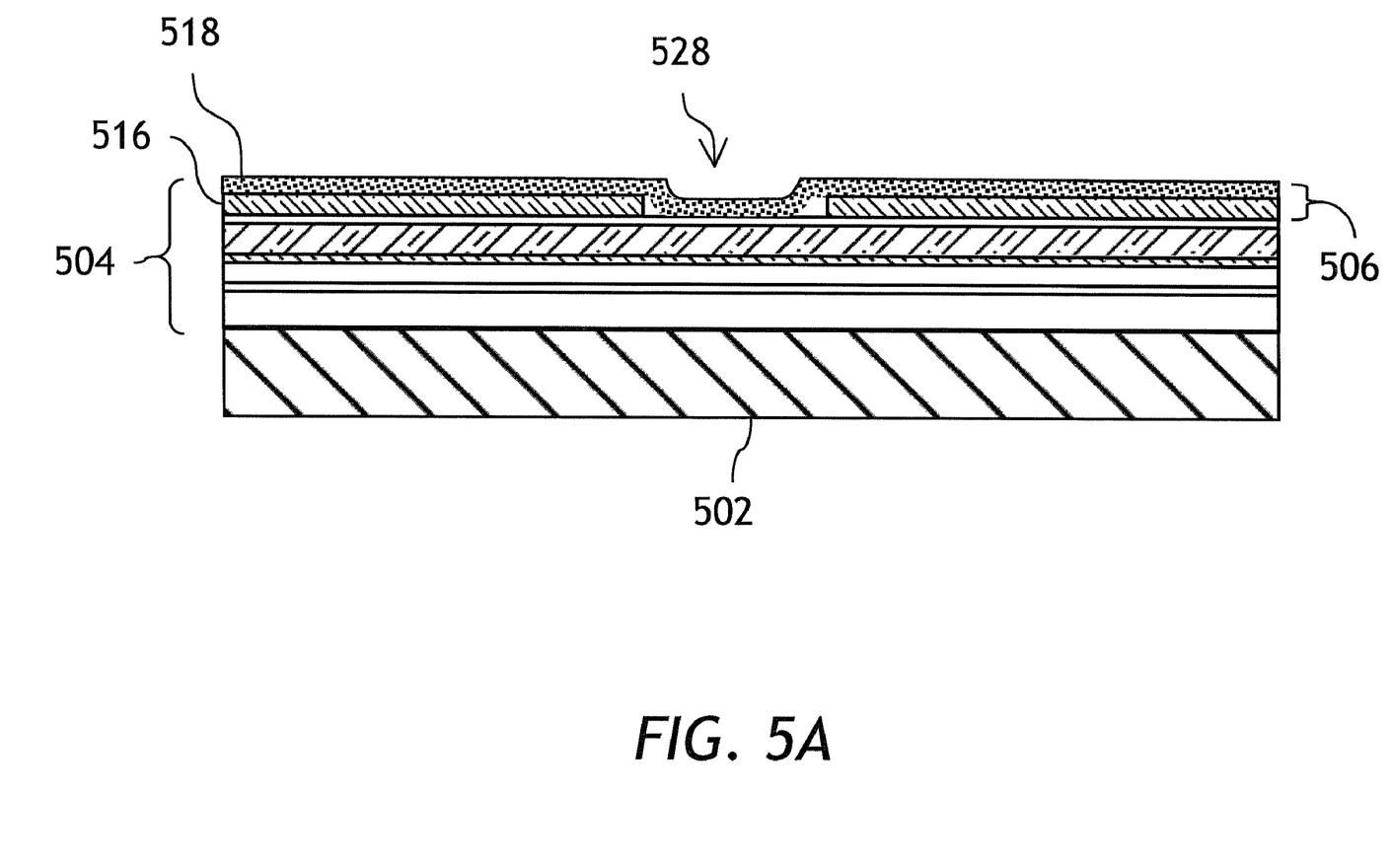
FIG. 5A-C illustrate manufacturing steps required to produce an avalanche photodiode of FIG. 4.

FIGS. 5A-C illustrate steps of manufacturing an avalanche photodiode of FIG. 4. In FIG. 5A, an avalanche photodiode semiconductor stack 504 is formed according to methods well established in the art. A recess 528 is produced photolithographically in the window layer 506. In order to produce recess 528, a photoresist is spin-coated onto the window layer 506, a desired recess pattern is exposed, the photoresist is processed to form an opening, and the recess 528 is etched in the window layer 506. The photoresist is stripped away, and a doped sub-layer 518 is then formed in the window layer 506 by diffusing Zn over entire area of the window layer 506. Note that, since the doping is performed over the entire area of the window layer 506, no additional photolithographic steps are required. A buried ion implantation region 516 is then formed by, firstly, masking central recessed region using photolithography, secondly, depositing the implant, and thirdly, stripping the implant photoresist.

Figure 5B:
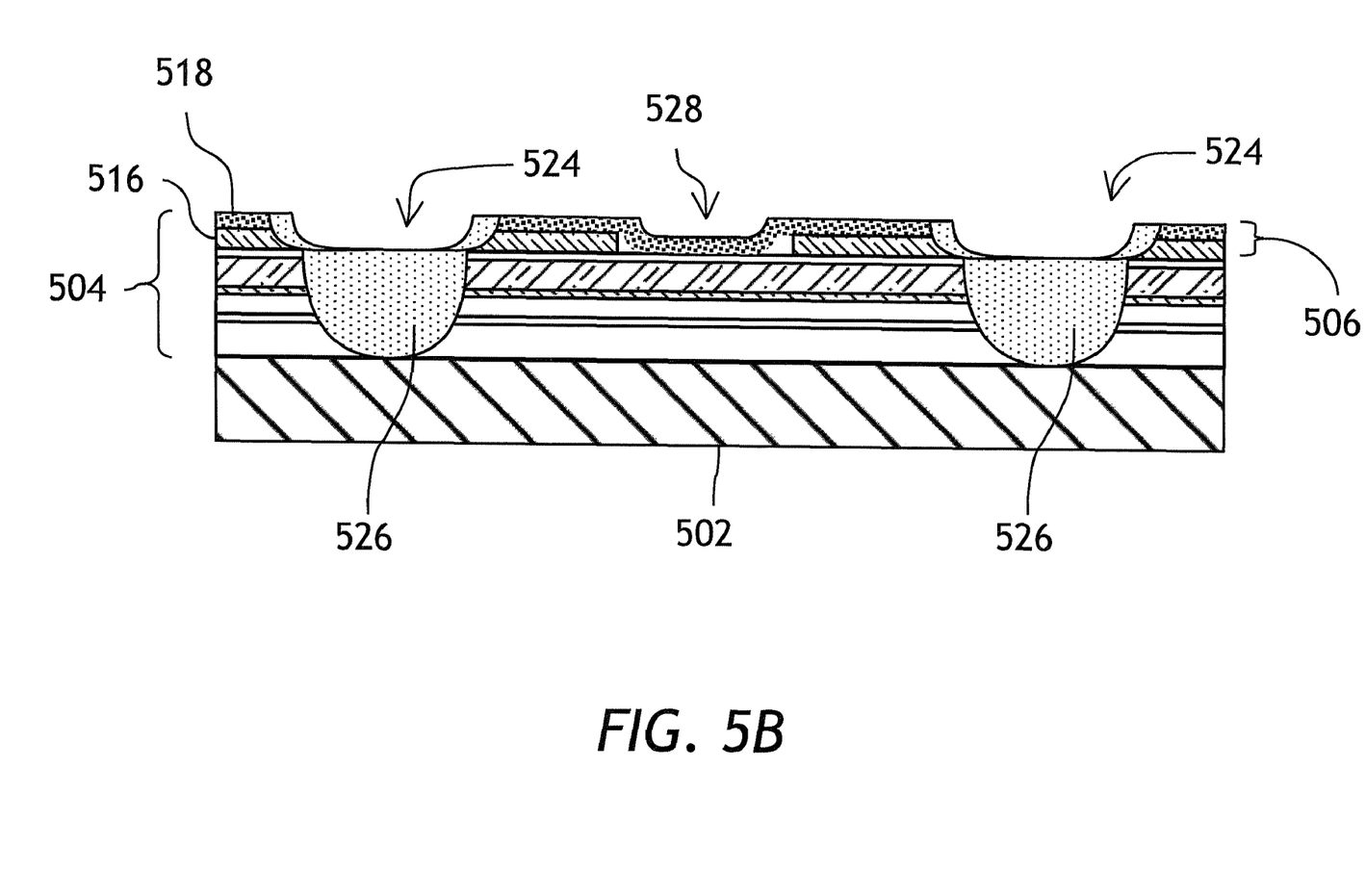

FIG. 5B illustrates the process of forming isolation trench 524 and ion implantation region 526 around the device. The trench 524 is etched through a mask of spin-coated, exposed, and processed layer of a suitable photoresist. Then, an implant photoresist is coated and processed, and second ion implantation step is performed through the implant photoresist mask, so as to limit the implantation to the trench 524.

Figure 5C:
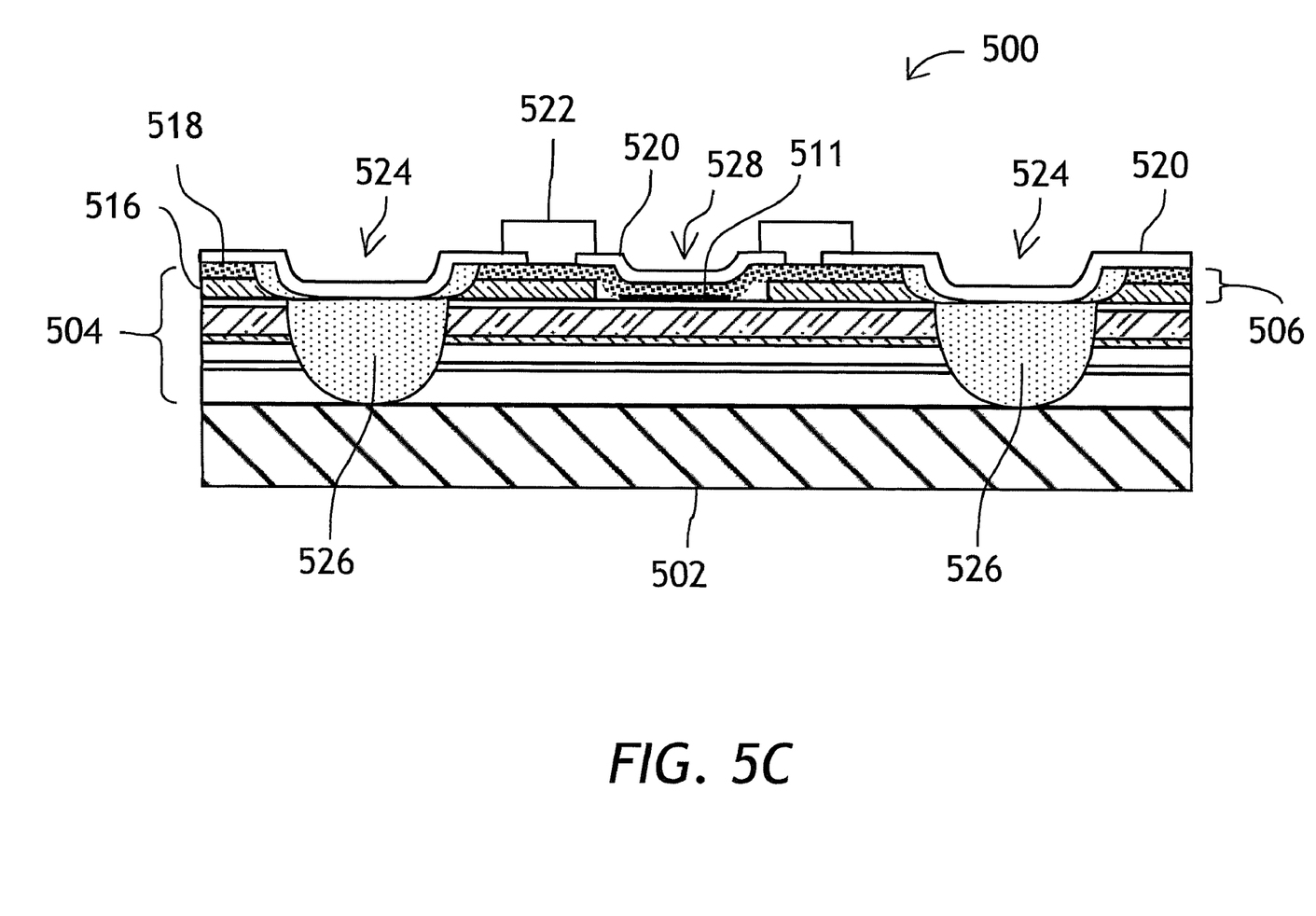

Finally, as shown in FIG. 5C, a passivating nitride layer 520 is formed over the semiconductor layer stack 504 in order to passivate the entire window layer 506 and simultaneously provide an anti-reflective coating above the p-n junction 511. Openings in the form of vias are formed in the passivating layer 520 and the top metal 522 is deposited over the vias, so as to provide an electrical contact with the doped sub-layer 518. A bottom electrode, not shown, is then applied to the substrate 502. An avalanche photodiode 500 is thereby formed.

Figure 6:
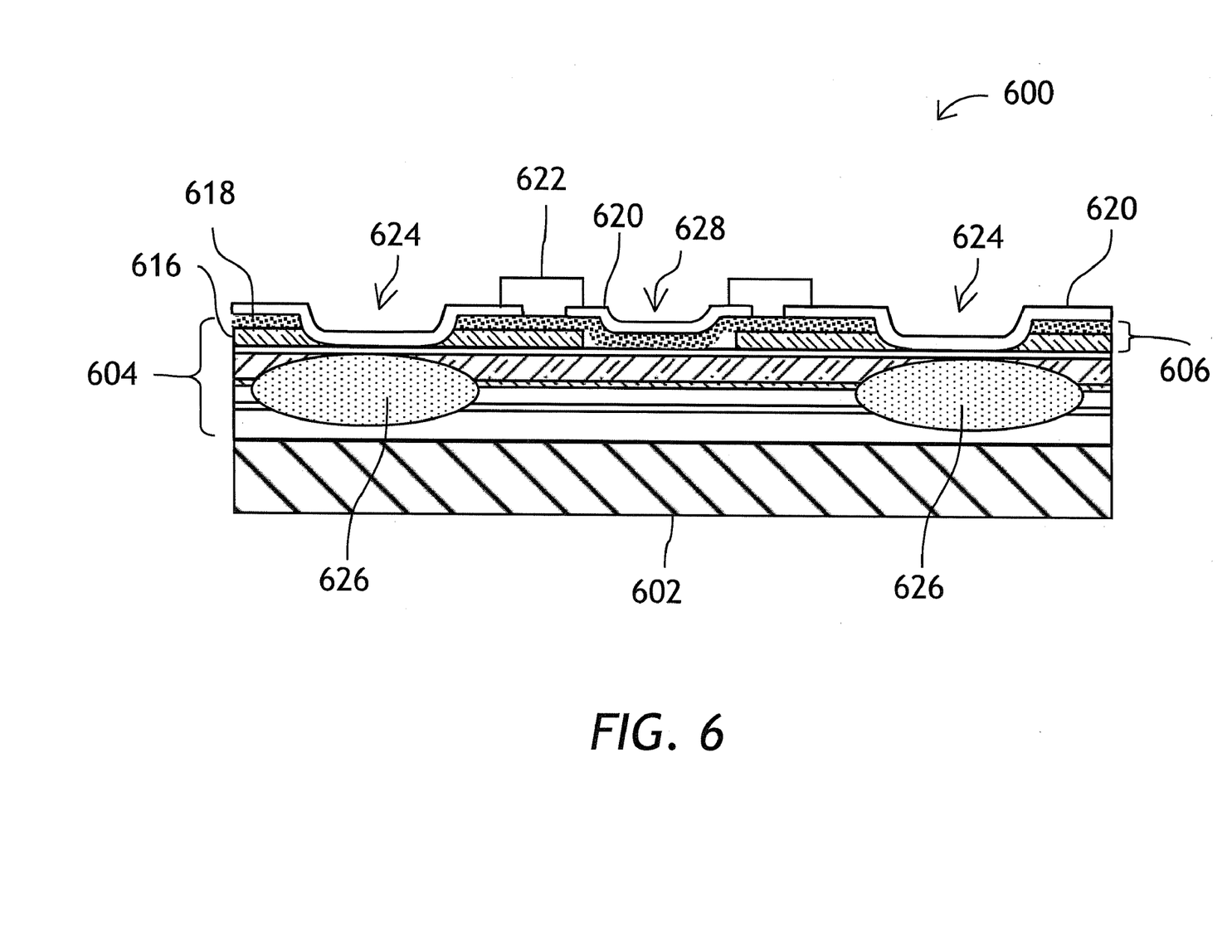
FIG. 6 is a cross-sectional view of an avalanche photodiode with buried ion implantation for passivation of narrow-bandgap absorption layer; and, FIG. 7 is a cross-sectional view of an avalanche photodiode with multi-energy buried ion implantation for passivating entire avalanche photodiode stack.

Turning now to FIG. 6, an alternative embodiment of an avalanche photodiode 600 is shown. The photodiode 600 has substrate 602 supporting a semiconductor layer stack 604 containing window layer 606 having doped sub-layer 618 and first buried implant 616. In photodiode 600, the second implantation region is formed by buried ion implantation under the isolation trench 624. The top contact 622 is formed in a similar fashion to the photodiode of FIG. 5, by etching vias in the passivating layer 620 and depositing the top contact metal 622 around the recessed area 628 over the vias. The steps of manufacturing the avalanche photodiode of FIG. 6 are similar to those shown in FIG. 5, with the difference being that the second implantation step is a buried implantation step.

Figure 7:
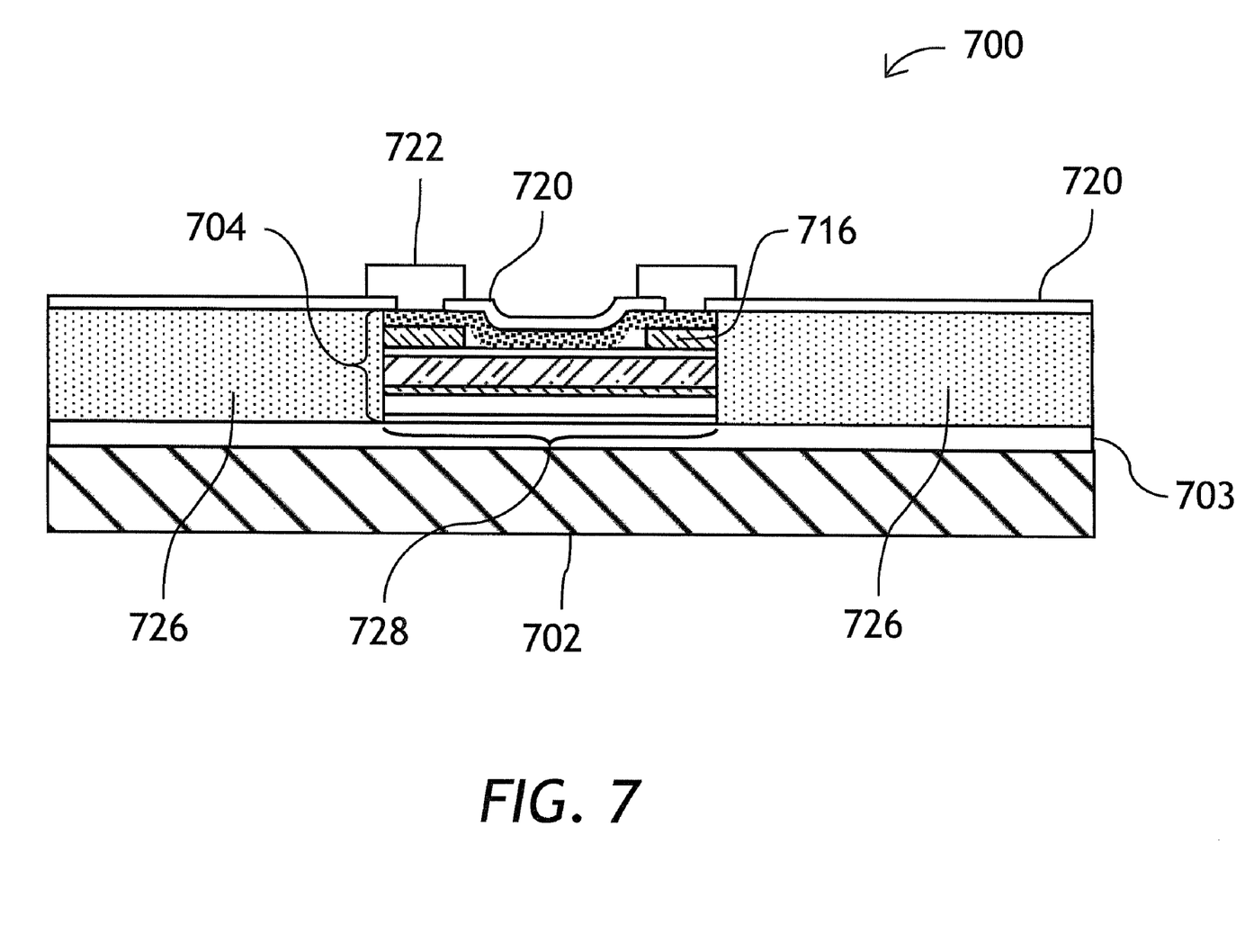

FIG. 7 illustrates the structure of yet another preferred embodiment of an avalanche photodiode of the present invention. Avalanche photodiode 700 includes a substrate 702 supporting a buffer layer 703 and a semiconductor layer stack 704 which is passivated through its entire thickness by creating a buried ion implantation region 726 all around the contact metal 722 by utilizing multi-energy ion implantation process. The wide multi-energy buried ion implantation region 726 is preferable as compared to analogous regions, e.g. region 626 in FIG. 6, and region 426 in FIG. 4, for two main reasons. Firstly, the reliability of the photodiode 700 is enhanced since it is completely passivated by a protective nitride layer 720 on the top, and by an extensive multi-energy buried ion implantation region 726 on the sides of the avalanche photodiode 700, the region 726 running all the way from protective nitride layer 720 on top, to the buffer layer 703 on the bottom of semiconductor layer stack. Secondly, calculations show that, even with buried ion implantation regions 416 as shown in FIG. 4 and regions 616 in FIG. 6, the electric field has a tendency to spread out under the isolation regions 416 and 616 thereby somewhat increasing the electric capacitance. With the extensive multi-energy buried ion implantation region 726 however, the electric field remains limited to a region 728 under the contact metal 722, throughout entire thickness of stack 704. As a result, the capacitance of the photodiode 700 decreases even further and gain-bandwidth product increases even further.

The embodiments illustrated in FIG. 2 through FIG. 7 are most useful for a top-illuminating configuration of a photodiode, but some aspects of the invention, such as passivation and reducing electrical capacitance by buried ion implantation, can be utilized for the bottom-illumination configuration as well. Both one-top contact configuration on a doped substrate and two-top-contact configurations on a doped or semi-insulating substrate can be readily implemented by those skilled in the art, in the spirit of present invention, in a single device or an array of devices, and on $n^+$-InP substrate or Si substrate. Other photosensitivity enhancement design approaches, such as a distributed Bragg reflector resonant-cavity design and/or a metal mirror reflector design, can also be successfully applied to improve the photodiode characteristics.

What is claimed is:

1. A semiconductor photodiode, comprising:
    a semiconductor substrate;
    a stack of layers on said substrate, including an absorption layer and a window layer on the top of the stack;
        wherein the window layer has a recess to a predetermined depth and lateral extent, and the recess has a lateral periphery;
        wherein the recess has a substantially flat portion, and a wall surrounding the recess runs smoothly and gradually from a level of the recess to a level of a surface of the window layer, so that in operation, the strength of an electric field adjacent to the wall is less than 200% of the strength of an electric field near and under the substantially flat portion of the recess;
        wherein the window layer is doped so as to form a doped sub-layer therein, and the doped sub-layer forms, in the recess of the window layer, a p-n junction at a boundary with a next layer in the stack, and wherein said p-n junction defines a photosensitive area of the photodiode; and
    a first electrical isolation region surrounding the periphery of the recess, wherein said first electrical isolation region is formed by ion implantation or wet oxidation and is buried underneath the doped sub-layer, so as to confine a flow of electric current to the p-n junction.

2. A semiconductor photodiode of claim 1 further comprising:
    an isolation trench in the window layer, wherein said trench surrounds, at a predetermined distance, the periphery of the recess in the window layer; and
    a second electrical isolation region in the isolation trench, wherein said second isolation region runs through the absorption layer, and said second isolation region is formed by either ion implantation or wet oxidation.

3. A semiconductor photodiode of claim 1 further comprising a second electrical isolation region surrounding, at a predetermined distance, the periphery of the recess in the window layer and running continuously from the window layer down to a bottom layer of the stack, wherein said second electrical isolation region is formed by multi-energy buried ion implantation or wet oxidation.

4. A semiconductor photodiode of claim 1 wherein the semiconductor photodiode layer stack comprises a p-layer, an i-layer, and an n-layer of a p-i-n photodiode.

5. A semiconductor photodiode of claim 1 wherein the semiconductor photodiode layer stack comprises a multiplication layer, a field-control charge layer, and an absorption layer of an avalanche photodiode.

6. A semiconductor photodiode of claim 1 wherein the substrate is a n-substrate or a Si-substrate.

7. A semiconductor photodiode of claim 4 wherein the absorption layer is InGaAs layer.

8. A semiconductor photodiode of claim 5 wherein the substrate is an $n^+$-InP substrate, the multiplication layer is an InAlAs layer, the field-control charge layer is an InP or an InAlAs layer, the absorption layer is an i-InGaAs layer, and the window layer is a n-InP or InAlAs/InP layer, and wherein the semiconductor layer stack further comprises: a $n^+$-InP and a $n^+$-InAlAs buffer layers located between the substrate and the multiplication layer; and an i-InGaAsP or an InAlGaAs grading layer located between the absorption layer and the window layer.

9. A semiconductor photodiode of claim 1 further comprising:
a passivation layer on top of the window layer, wherein the passivation layer is selected from a group consisting of BCB, polyimide, $SiN_x$, and $SiO_2$ layers;
vias in the passivation layer, wherein the vias are located around the lateral periphery of the recess; and
a first metal contact layer on top of passivation layer, wherein the first metal contact layer surrounds the periphery of the recess and contacts the doped sub-layer of the window layer through the vias.

10. A semiconductor photodiode of claim 1 wherein the stack of layers forms a resonant optical cavity.

11. A semiconductor photodiode of claim 1 wherein the substrate is coated with a reflective metal coating arranged so as to reflect light which has passed through the absorption layer, back towards said absorption layer.

12. A semiconductor photodiode of claim 1 arranged so as to detect light arriving from the side of the semiconductor substrate.

13. An array of semiconductor photodiodes of claim 1 consisting of two or more photodiodes.

14. A semiconductor photodiode of claim 9 further comprising a second metal contact layer, wherein said second metal contact layer is electrically coupled to the semiconductor substrate.

15. A semiconductor photodiode of claim 14 wherein the second metal contact layer is located on the same side of the substrate as the first metal contact layer.

* * * * *